United States Patent [19]

Inami et al.

[11] Patent Number: 5,587,667
[45] Date of Patent: Dec. 24, 1996

[54] OUTPUT BUFFER CIRCUIT FOR HIGH-SPEED LOGIC OPERATION

[75] Inventors: Daijiro Inami, Tokyo; Yuichi Sato, Miyagi, both of Japan

[73] Assignee: NEC Corporation, Tokyo, Japan

[21] Appl. No.: 575,118

[22] Filed: Dec. 19, 1995

[30] Foreign Application Priority Data

Dec. 20, 1994 [JP] Japan ................................. 6-316725

[51] Int. Cl.⁶ ................................................ H03K 19/017
[52] U.S. Cl. .................... 326/17; 326/34; 326/83; 326/119
[58] Field of Search ........................ 326/17, 21, 31, 326/33, 34, 83, 86, 119; 327/530, 543

[56] References Cited

U.S. PATENT DOCUMENTS

| | | | |
|---|---|---|---|
| 5,257,238 | 10/1993 | Lee et al. | 365/230.06 |
| 5,365,123 | 11/1994 | Nakase et al. | 326/110 X |
| 5,440,243 | 8/1995 | Lyon | 326/33 |
| 5,444,410 | 8/1995 | Polhemus | 327/317 |

*Primary Examiner*—David R. Hudspeth
*Attorney, Agent, or Firm*—Young & Thompson

[57] ABSTRACT

An output buffer circuit is provided, which enables to reduce the delay of a digital output signal with respect to an input digital signal. The output buffer circuit includes first and second FETs serially connected to each other. A gate of the first FET is applied with a first digital input signal. A gate of the second FET is applied with a second digital input signal. The first and second FETs operate to be opposite or complementary in logic state to each other. A digital output signal is taken out from a connection point of the first and second FETs. The circuit further includes a current source for causing a bias current having the same direction or polarity as that of a drain current of the first FET to flow through the first FET in the pseudo-OFF state. A turn-on speed of the first FET from the pseudo-OFF state to the ON state is enhanced by the bias current.

20 Claims, 4 Drawing Sheets

OUTPUT BUFFER CIRCUIT FOR HIGH-SPEED LOGIC OPERATION

BACKGROUND OF THE INVENTION

1. Field of the Invention

The present invention relates to an output buffer circuit and more particularly, to an output buffer circuit applicable to high-speed logic operation using two field-effect transistors (FETs) serially connected to each other, which is preferably realized on semiconductor integrated circuits.

2. Description of the Prior Art

Figure 1:
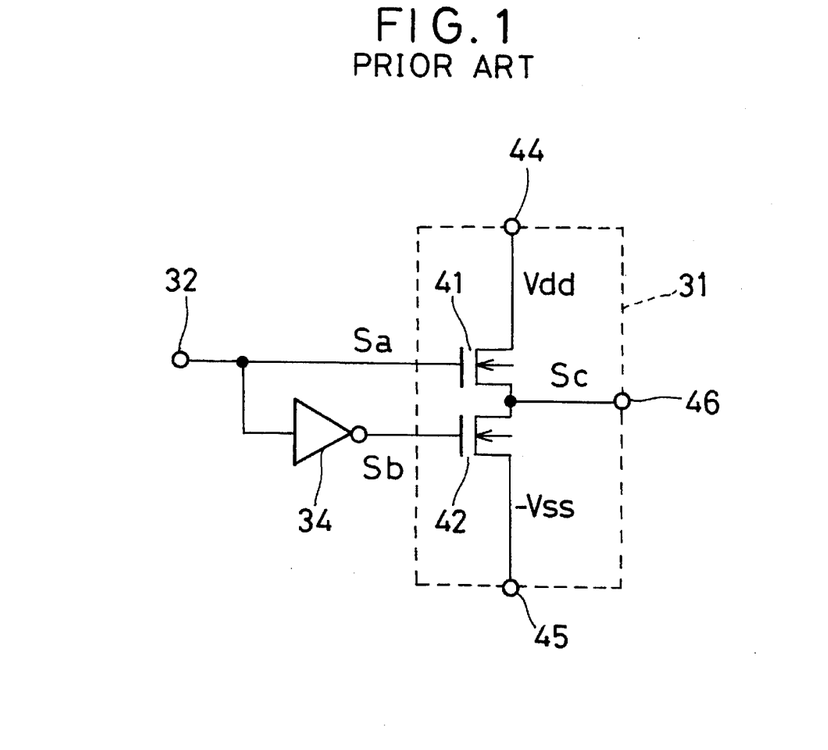
FIG. 1 is a circuit diagram of a conventional output buffer circuit.

FIG. 1 shows a conventional output buffer circuit 31, which has first and second n-channel enhancement metal-oxide-semiconductor FETs (MOSFETs) 41 and 42 serially connected to each other. The MOSFETs 41 and 42 are provided between a positive supply terminal 44 and a negative supply terminal 45 of the circuit 31.

A drain of the first MOSFET 41 is connected to the positive supply terminal 44 and is applied with a positive supply voltage $+V_{dd}$. A source of the first MOSFET 41 is connected to a drain of the second MOSFET 42. A source of the second MOSFET 42 is connected to the negative supply terminal 45 and is applied with a negative supply voltage—$V_{ss}$.

An output terminal 46 of the circuit 31 is connected to the connection point of the source of the first MOSFET 41 and the drain of the second MOSFET 42. A digital output signal Sc is taken out from the output terminal 46.

A gate of the first MOSFET 41 is directly connected to an input terminal 32 outside the circuit 31. This gate is applied with a first digital input signal Sa that is supplied into the input terminal 32.

A gate of the second MOSFET 42 is connected to the input terminal 32 through an inverter 34. A gate of the second MOSFET 42 is connected to an output end of the inverter 34. An input end of the inverter 34 is connected to the input terminal 32. The gate of the second MOSFET 42 is applied with a second digital input signal Sb. The second input signal Sb is produced by inverting the logic state of the first input signal Sa by the inverter 34.

The first input signal Sa is of a positive logic and the second input signal Sb is of a negative logic. Therefore, the second input signal Sb is always opposite in logic state to the first input signal Sa.

When the first input signal sa is in the high or "H" level, the second input signal Sb is in the low or "L" level. Therefore, the first enhancement MOSFET 41 is ON or conductive and the second enhancement MOSFET 42 is OFF or nonconductive and as a result, the output signal Sc is in the high or H level.

On the other hand, when the first input signal Sa is in the L level, the second input signal Sb is in the H level. Therefore, the first MOSFET 41 is OFF and the second MOSFET 42 is ON and as a result, the output signal Sc is in the L level.

Thus, if one of the first and second MOSFETs 41 and 42 is ON, the other thereof is always OFF, which means that none of the MOSFETs 41 and 42 are ON simultaneously. Accordingly, no current flows through the MOSFETs 41 and 42 in either steady state except for a leakage current of the MOSFET 41 or 42, resulting in low power dissipation.

The conventional output buffer circuit 31 described above has the following problem.

When the output signal Sc is turned from the L level to the H level, in other words, the first input signal Sa is turned from the L level to the H level, the first MOSFET 41 cannot be rapidly changed from the nonconductive state to the conductive state. Consequently, the circuit 31 cannot respond quickly to the rapid transition of the first input signal Sa because the output signal Sc is delayed to rise with respect to the first input signal Sa.

This problem is caused by the fact that the first MOSFET 41 needs to have the gate-to-source voltage $V_{GS}$ greater than its threshold voltage $V_{TH}$ in order to be turned on. The MOSFET 41 starts to be turned on after the delay in which the gate-to-source voltage $V_{TH}$ increases from the ground to the threshold voltage $V_{TH}$ and therefore, the output signal Sc starts to rise after the same delay.

SUMMARY OF THE INVENTION

Accordingly, an object of the present invention is to provide an output buffer circuit that enables to reduce the delay of a digital output signal with respect to an input digital signal.

Another object of the present invention is to provide an output buffer circuit applicable to high-speed logic operation.

Still another object of the present invention is to provide an output buffer circuit that can provide a function of limiting the swing of an output signal, thereby enhancing the high-speed logic operation.

These objects together with others not specifically mentioned will become clear to those skilled in the art from the following description.

An output buffer circuit according to the present invention includes first and second FETs serially connected to each other. A gate of the first FET is applied with a first digital input signal. A gate of the second FET is applied with a second digital input signal. The first and second FETs operate to be opposite or complementary in logic state to each other. A digital output signal is taken out from a connection point of the first and second FETs.

The circuit further includes a current source for causing a bias current having the same direction or polarity as that of a drain current of the first FET to flow through the first FET in the pseudo-OFF state.

The "pseudo-OFF state" is defined as an OFF state that is the same as the ordinary OFF state of the first FET if the bias current does not flow through the first FET.

With the output buffer circuit according to the present invention, when the first FET is in the pseudo-OFF state, the bias current having-the same direction or polarity as that of a drain current of the first FET flows through the first FET by the current source. Therefore, in the next turn-on process, the drain current of the first FET starts to increase from the value of the bias current to a specified turn-on current value. This means that the first FET can be turned on more quickly than the case in which no bias current is supplied to the first FET in the ordinary OFF state.

As a result, the output buffer circuit according to the present invention can reduce the delay of the output signal with respect to the first input signal. This means that the circuit according to the present invention can be applied to high-speed logic operation.

Also, as the bias current is supplied to the first FET in the pseudo-OFF state, the gate-to-source voltage of the first FET is increased. Accordingly, the swing of the output signal is reduced compared with the case in which no current is supplied to the second FET in the OFF state.

The first and second FETs may be made of any FET; however, they are preferably made of MOSFETs, because they are readily formed on the large-scale integrated circuits (LSIs).

Also, though the first and second FETs may be of an enhancement or depletion type, the enhancement type is preferred since the advantage of the invention can be effectively obtained.

The conductivity type of the first and second FETs may be the same as or different from each other if the first and second input signals opposite in logic state to each other are applied to the gates of the first and second FETs, respectively.

The bias current may be set as any value if it has the same direction or polarity as that of a drain current of the first FET. The maximum value of the bias current is limited by the maximum current value that is allowed to flow by the first FET in the pseudo-OFF state. However, if the current value is far greater than the threshold current, the power dissipation of this output buffer circuit becomes very large. As a result, the bias current value is preferably set as a value near the threshold current of the first PET. More preferably, the bias current value is slightly greater than the threshold current.

It is preferred that the bias current $I_b$ is set as any value in the range of $I_{TH} < I_b \leq 100 I_{TH}$, where $I_{TH}$ is the threshold current of the first FET. In this case, both the reduced signal delay and low power dissipation can be performed.

It is more preferred that the bias current $I_b$ is set as any value in the range of $2I_{TH} \leq I_b \leq 50 I_{TH}$. In this case, a margin for the threshold current fluctuation is given and therefore, the effect of the signal delay reduction is ensured to be accomplished even if the threshold current fluctuation is caused by the variation of the fabrication process conditions. Also, the power dissipation can be restrained.

In a preferred embodiment, the current source is composed of a third FET connected in parallel to the second FET and a voltage source for supplying a bias voltage to a gate of the third FET. An additional advantage that the bias current value can be readily adjusted by changing the bias voltage value is obtained.

The voltage source is preferably made of a fourth FET whose gate is connected to a gate of the third FET. The gate and a drain of the fourth FET are connected to each other. An additional advantage that the voltage source can be simply configured is provided.

A fifth FET whose gate and drain are connected to each other or a resistor may be additionally provided for the voltage source. In this case, an advantage that the bias voltage can be readily adjusted by changing the resistance of the fifth FET or the resistor is provided.

In another preferred embodiment, the current source is composed of a current mirror made of third and fourth FETs. The third PET is connected in parallel to the second FET and produces the bias current. The fourth PET produces a reference current. The bias current is proportional to the reference current. An additional advantage that the bias current is not affected by the threshold voltage fluctuation is obtained. There is a further additional advantage that the bias current is not affected by the threshold voltage fluctuation and that the bias current can be determined by the gate-width to gate-length ratios of the third and fourth FETs is obtained.

The output buffer circuit according to the invention can be applied to various purposes other than the output buffer circuit.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to FIGS. 2 to 8.

FIRST EMBODIMENT

Figure 2:
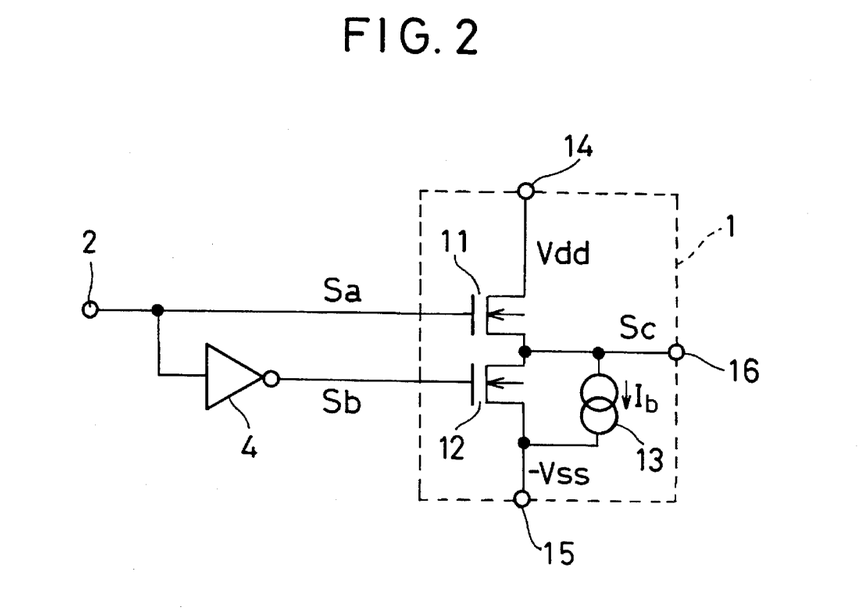
FIG. 2 is a circuit diagram of an output buffer circuit according to a first embodiment of the invention.

As shown in FIG. 2, an output buffer circuit 1 according to a first embodiment has a first n-channel enhancement MOSFET 11 and a second n-channel enhancement MOSFET 12 that are serially connected to each other. The MOSFETs 11 and 12 are provided between a positive supply terminal 14 and a negative supply terminal of the circuit 1.

Specifically, a drain of the first MOSFET 11 is connected to the positive supply terminal 14 and is applied with a positive supply voltage $+V_{dd}$. A source of the first MOSFET 11 is connected to a drain of the second MOSFET 12, A source of the second MOSFET 12 is connected to the negative supply terminal 15 and is applied with a negative supply voltage $-V_{SS}$.

An output terminal 16 is connected to the connection point of the source of the first MOSFET 11 and the drain of the second MOSFET 12. A digital output signal Sc is taken out from the output terminal 16.

A gate of the first MOSFET 11 is directly connected to an input terminal 12 provided outside the buffer circuit 1. This gate is applied with a first digital input signal Sa that is supplied into the input terminal 2.

A gate of the second MOSFET 12 is connected to the input terminal 12 through an inverter 4. A gate of the second MOSFET 12 is connected to an output end of the inverter 4. An input end of the inverter 4 is connected to the input terminal 2. The gate of the second MOSFET 12 is applied with a second digital input signal Sb. The second input signal Sb is produced by inverting the logic state of the first input signal Sa by the inverter 4.

The first input signal Sa is of a positive logic and the second input signal Sb is of a negative logic. Therefore, the second input signal Sb is always opposite or complementary in logic state to the first input signal Sa. In other words, the first and second FETs operate to be opposite or complementary in logic state to each other.

When the first input signal Sa is in the M (high) level, the second input signal Sb is in the L (low) level. At this time, the first enhancement MOSFET 11 is ON or conductive and the second enhancement MOSFET 12 is OFF or nonconductive and as a result, the output signal Sc is in the H level.

On the other hand, when the first input signal Sa is in the L level, the second input signal Sb is in the H level. At this time, the first MOSFET 11 is OFF and the second MOSFET 12 is ON and as a result, the output signal Sc is in the L level.

Thus, none of the first and second MOSFETs 11 and 12 is ON simultaneously and accordingly, no current flows through the MOSFETs 11 and 12 in either steady state except for a leakage current of the MOSFET 11 or 12, resulting in low power dissipation.

The above configuration is the same as that of the conventional output buffer circuit 31 shown in FIG. 1.

Unlike the conventional circuit 31, the output buffer circuit 1 of the invention has a constant current source 13 connected in parallel to the second MOSFET 12. One end of the current source 13 is connected to the connection point of the drain of the second MOSFET 12 and the source of the first MOSFET 11. The other end of the current source 13 is connected to the source of the second MOSFET 12.

The current source 13 produces a constant current as a bias current $I_b$ for the first MOSFET 11. The bias current $I_b$ has the same flowing direction or polarity as that of a drain current of the first MOSFET 11.

When the first MOSFET 11 is in the ON state, that is, the output signal Sc is in the H level, the bias current $I_b$ flows from the positive supply terminal 14 to the negative supply terminal 15 through the first MOSFET 11 and the current source 13.

The bias current $I_b$ continues to flow through the first MOSFET 11 even when the first MOSFET 11 is in the OFF state, that is, the output signal Sc is in the L level. In other words, the bias current $I_b$ is extracted from the first MOSFET 11 as a leakage current even if the MOSFET 11 is in the OFF state. In the present invention, this state where the bias current $I_b$ flows through the first MOSFET 11 in spite of no drain current flowing therethrough is termed the "pseudo-OFF" state.

Accordingly, in the next turn-on process of the first MOSFET 11, the drain current starts to increase from the bias current $I_b$, not from zero. This means that the first MOSFET 11 can turn on more quickly than the conventional circuit 31 in which no bias current is supplied to the first MOSFET 11 in the OFF state.

Consequently, the output buffer circuit 1 according to the first embodiment can reduce the delay time of rising of the digital output signal Sc with respect to the first input digital signal Sa. Therefore, the circuit 1 is applicable to high-speed logic operation.

Also, as the bias current $I_b$ flows through the first MOSFET 11 even in the pseudo-OFF state, the swing of the output signal Sc can be reduced compared with the conventional circuit 31.

Next, the principles of the signal delay reduction and the output swing reduction are explained in more detail below.

Figure 8:
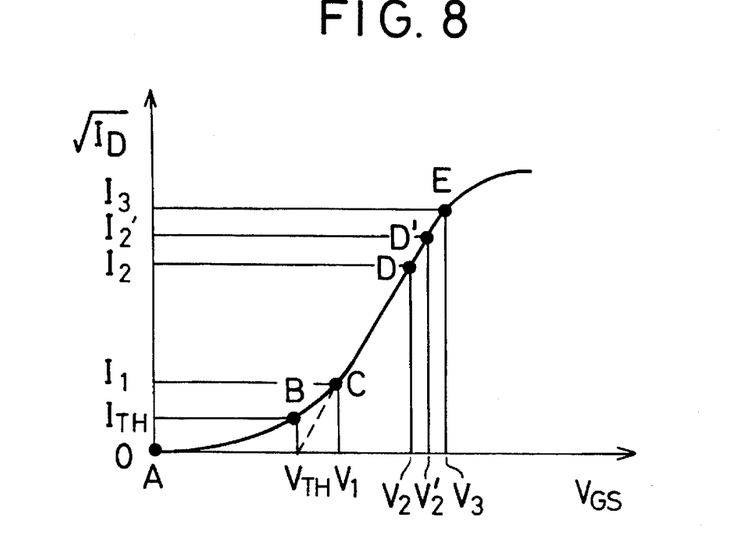
FIG. 8 is a diagram showing the $I_D$-$V_{GS}$ characteristics of an n-channel enhancement MOSFET operating in the saturation region.

FIG. 8 shows a typical transfer characteristic of an n-channel enhancement MOSFET operating in the saturation region for $V_{DS} > (V_{GS} - V_{TH})$, where $V_{DS}$, $V_{GS}$, $V_{TH}$ and $I_D$ are a drain-to-source voltage, a gate-to-source voltage, the threshold voltage, and a drain current of the MOSFET, respectively.

As seen from FIG. 8, the drain current $I_D$ starts to gradually increase from zero (0) at a point A with the increasing gate-to-source voltage $V_{GS}$ to the threshold current $I_{TH}$ at a point B where $V_{GS} = V_{TH}$. The drain current $I_D$ then increases linearly according to the square-root law in the range from the point B to a point E where $V_{GS} = V_3$ and $I_D = I_3$ as $V_{GS}$ increases. In the region where $V_{GS} > V_3$ or $I_D > I_3$, although the drain current $I_D$ further increases, the increase is not linearly, The square-root or law of the MOSFET is expressed as the following equation (1):

$$I_D = K \left( \frac{W}{L} \right) (V_{GS} - V_{TH})^2 \quad (1)$$

where K is a constant, and L and W are the channel-length and channel-width of the MOSFET, respectively.

In the output buffer circuit 1 according to the first embodiment, the first MOSFET 11 operates at an operating point D' where $V_{GS} = V_2'$ and $I_D = I_2'$ in the ON state, and it operates at an operating point C where $V_{GS} = V_1$ and $I_D = I_1$ near the point B in the pseudo-OFF state due to the bias current $I_b$. The voltage $V_1$ is greater than the threshold voltage $V_{TH}$ and less than the voltage $V_2'$ i.e., $V_{TH} < V_1 < V_2'$. The current $I_1$ is greater than the threshold current and less than the current $I_2'$, i.e., $I_{TH} < I_1 < I_2'$. The bias current $I_b$ continues to flow through the first MOSFET 11 in the pseudo-OFF state, and therefore, $I_1 = I_b$ is established.

As described above, in a turn-on process of the first MOSFET 11, since the bias current $I_b$ (=$I_1$) that is slightly greater than the threshold current $I_{TH}$ continues to flow through the first MOSFET 11 in the pseudo-OFF state, the drain current $I_D$ of the first MOSFET 11 starts to increase from $I_1$ and ends at $I_2'$ to be turned on. In other words, the gate-to-source voltage $V_{GS}$ of the first MOSFET 11 starts to increase from $V_1$ and ends at $V_2'$ to be turned on.

On the other hand, with the conventional output buffer circuit 31, since no bias current flows through the first MOSFET 41, the first MOSFET 41 operates at an operating point D where $V_{GS} = V_2$ ($< V_2'$) and $I_D = I_2$ ($< I_2'$) in the ON state, and it operates at an operating point A where $V_{GS} = 0$ and $I_D 0$ in the OFF state.

In a turn-on process of the first MOSFET 41, since no bias current flows through the first MOSFET 41 in the OFF state, the drain current $I_D$ of the first MOSFET 41 starts to increase from zero and ends at $I_2$ to be turned on. In other words, the gate-to-source voltage $V_{GS}$ of the first MOSFET 41 starts to increase from zero and ends at $V_2$ to be turned on.

Thus, the circuit according to the first embodiment has a shorter turn-on time of the first MOSFET 11 than the conventional circuit 31. In other words, the first MOSFET 11 of the circuit 1 can be turned on more quickly than that of the conventional circuit 31. Accordingly, the delay of the rising of the output signal Sc can be decreased.

Figure 3:
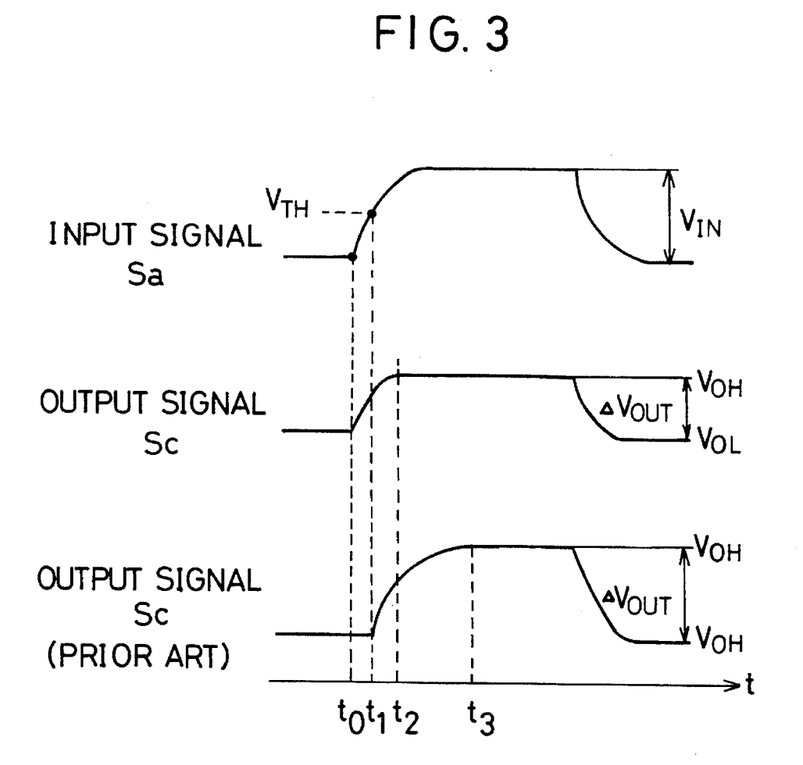
FIG. 3 is a time chart showing a time response of the output buffer circuit according to the first embodiment in FIG. 2 and the conventional output buffer circuit of FIG. 1.

FIG. 3 shows a time response of the output buffer circuit 1 according to the first embodiment and the conventional output buffer circuit 31.

As shown in FIG. 3, when the first input signal Sa starts to rise at $t_0$, the output signal Sc starts to rise approximately simultaneously with the first input signal Sa in the circuit 1 according to the first embodiment. Therefore, the output signal Sc starts to rise after substantially no delay time with respect to the rise of the first input signal Sa. The increase of the output Signal Sc ends at $t_2$.

In contrast, the output signal Sc starts to rise at $t_1$ in the conventional circuit 31, which means that it starts to rise after a delay time $(t_1-t_0)$ with respect to the rise of the first input signal Sa. The increase of the output signal Sc ends at $t_3$ that is later than $t_2$.

Thus, the output signal Sc has substantially no delay for the circuit 1 of the invention, and it has a delay of $(t_1-t_0)$ ($\neq 0$) for the conventional circuit 31.

Next, the principle of the voltage swing of the output signal Sc is explained.

As shown in FIG. 3, the output signal Sc has a high voltage level $V_{OH}$, a low voltage level $V_{OL}$, and a voltage swing $\Delta V_{OUT}$ ($=V_{OH}-V_{OL}$). The voltage swing $\Delta V_{OUT}$ for the circuit 1 of the first embodiment is smaller than that for the conventional circuit 31.

In the circuit 1, the bias current $I_b$ continues to flow through the first MOSFET 11 in the OFF state, and therefore, the gate-to-source voltage $V_{GS}$ of the first MOSFET 11 becomes higher compared with the case where no bias current is supplied. As a result, the high voltage level $V_{OH}$ of the output signal Sc decreases by a voltage corresponding to the reduction of $V_{GS}$. This means that the circuit 1 of the first embodiment has a function of limiting or reducing the voltage swing $\Delta V_{OUT}$ for the output signal Sc.

This voltage-swing reducing function for the output signal Sc enhances the turn-on speed of the first MOSFET 11, the reason of which is as follows:

In general, the operation speed of a logic circuit varies dependent upon the logic swing and the rise/fall time of the output signal Sc. When the signal Sc has a constant rising slope of the waveform, the response time of the signal Sc is proportional to its logic swing. Consequently, the rising/falling time is improved due to the voltage-swing reducing function.

The inventor performed a simulation under the condition that W=200 μm, L=0.35 μm, $I_{TH}$=1 μA, and $I_b$=50 μA. The simulation results stated that the rise time ($=t_3-t_1$) of the output signal Sc for the conventional circuit 31 was 25 ns or longer, and that the rise time ($=t_2-t_0$) for the circuit 1 of the first embodiment was 1.9 ns. It is clearly seen from the results that the circuit 1 has the highly decreased rise time of the output signal Sc compared with the conventional circuit 31, and that the operation speed of the circuit 1 is highly improved.

SECOND EMBODIMENT

Figure 4:
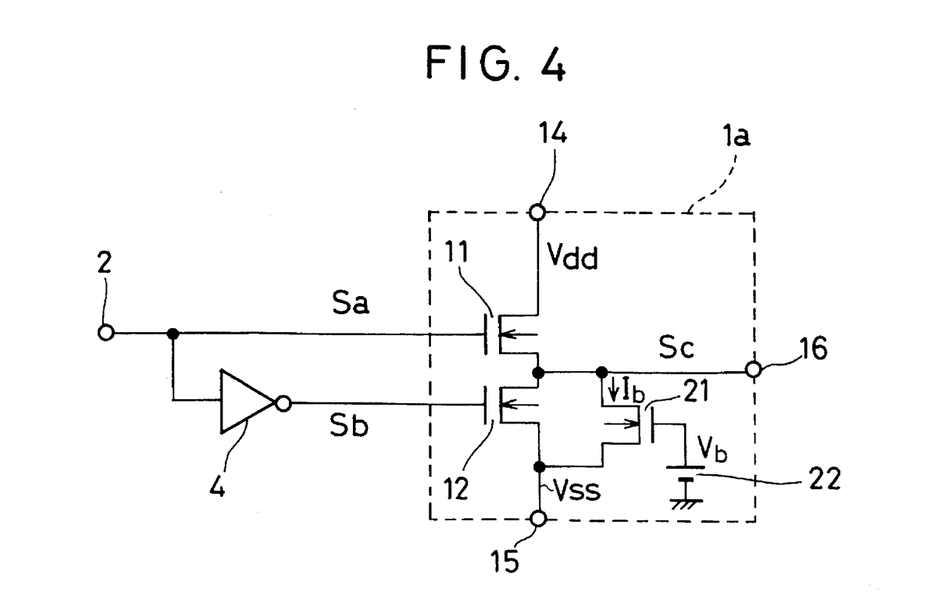
FIG. 4 is a circuit diagram of an output buffer circuit according to a second embodiment of the invention.

As shown in FIG. 4, an output buffer circuit 1a according to a second embodiment is the same in configuration as that of the first embodiment except that a third n-channel enhancement MOSFET 21 and a voltage source 22 are provided instead of the constant current source 13. Therefore, the description about the same configuration is omitted here by attaching the same reference numerals to the corresponding elements for the sake of simplification of description.

The third MOSFET 21 is connected in parallel to the second MOSFET 12. Specifically, the MOSFET 21 has a drain and a source connected to the drain and source of the MOSFET 12, respectively. One end of the voltage source 22 is connected to the gate of the third MOSFET 21 and the other end is grounded. The voltage source 22 supplies a positive constant voltage to a gate of the MOSFET 21 as a bias voltage $V_b$.

The third MOSFET 21 produces a drain current $I_D$ proportional to the applied bias voltage $V_b$. If the bias voltage $V_b$ is set to satisfy the equation of $I_D=I_b$, the same bias current $I_b$ as in the first embodiment is supplied to the first MOSFET 11 in the OFF state. Therefore, the same effects or advantages can be obtained in the second embodiment.

Also, an additional advantage that the bias current $I_b$ for the first MOSFET 11 can be readily adjusted by changing the constant bias voltage $V_b$ of the voltage source 22.

There is a further advantage that the bias current is not affected by the threshold voltage (or current) fluctuation caused during the fabrication process sequence, because the threshold voltage fluctuation is cancelled by the fluctuation of the bias current $I_b$.

THIRD EMBODIMENT

Figure 5:
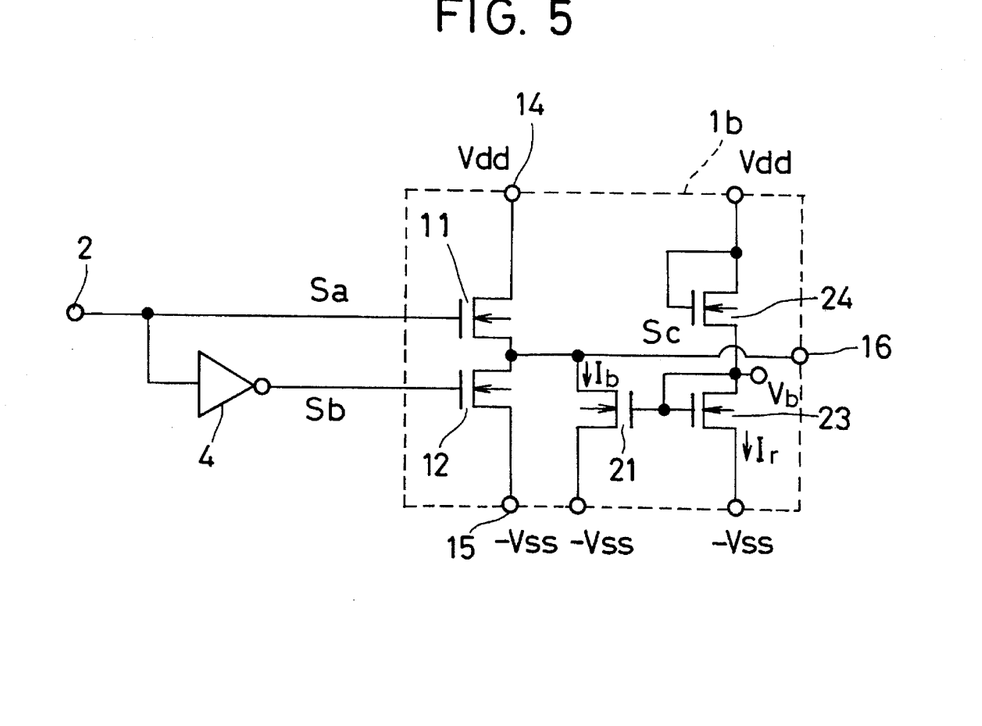
FIG. 5 is a circuit diagram of an output buffer circuit according to a third embodiment of the invention.

FIG. 5 shows an output buffer circuit 1b according to a third embodiment, which is the same in configuration as that of the second embodiment except that a fourth n-channel MOSFET 23 and a fifth n-channel MOSFET 24 are provided as the voltage source 22 in the second embodiment. Therefore, only the description about the different configuration is shown here for the sake of simplification of description.

The fourth MOSFET 23 whose gate and drain are coupled together and the fifth MOSFET 24 whose gate and drain are coupled together are serially connected to each other.

The gate and drain of the fourth MOSFET 23 is connected to the gate of the third MOSFET 21. A source of the MOSFET 23 is applied with the negative supply voltage—$V_{SS}$. A source of the fifth MOSFET 24 is connected to the drain and gate of the third MOSFET 23. The drain and gate of the fifth MOSFET 24 are applied with the positive supply voltage $+V_{dd}$. The two MOSFETs 23 and 24 have the same size.

The bias voltage $V_b$ produced by the fourth and fifth MOSFETs 23 and 24 is defined by the resistances of the two MOSFETs 23 and 24. The bias current $I_b$ is defined corresponding to the ratio of the gate-width to gate-length ratios of the third and fourth MOSFETs 21 and 23. That is, if the third and fourth MOSFETs 21 and 23 have the channel-width to channel-length ratios $(W/L)_{21}$ and $(W/L)_{23}$, respectively, the bias current $I_b$ is expressed by the following equation (2).

$$I_b = \frac{\left(\frac{W}{L}\right)_{21}}{\left(\frac{W}{L}\right)_{23}} I_v \qquad (2)$$

where $I_r$ is a reference current produced by the fourth and fifth MOSFETs 23 and 24.

Since the third and fourth MOSFETs 21 and 23 have the channel-width to channel-length ratios $(W/L)_{21}$ and $(W/L)_{23}$ that are equal to each other in the third embodiment for a simplified explanation, the reference current $I_r$ is equal to the bias current $I_b$ and is be expressed by the following equation (3).

$$I_r = I_b = K \left(\frac{W}{L}\right)_{21} \left(\frac{V_{dd}}{2} - V_{TH}\right)^2 \qquad (3)$$

If the threshold voltage $V_{TH}$ becomes higher or lower, the bias current $I_b$ increases or decreases corresponding to the change of the voltage $V_{TH}$. Accordingly, the ratio of the threshold current $I_{TH}$ and the bias current $I_b$ does not change.

The same effects or advantages as those in the second embodiment can be obtained in this third embodiment.

It can be said that the third, fourth and fifth MOSFETs 21, 23 and 24 constitute a current mirror circuit, in which the reference current $I_r$ is defined by the MOSFETs 23 and 24 and the bias current $I_b$ is defined by a mirror current.

FOURTH EMBODIMENT

Figure 6:
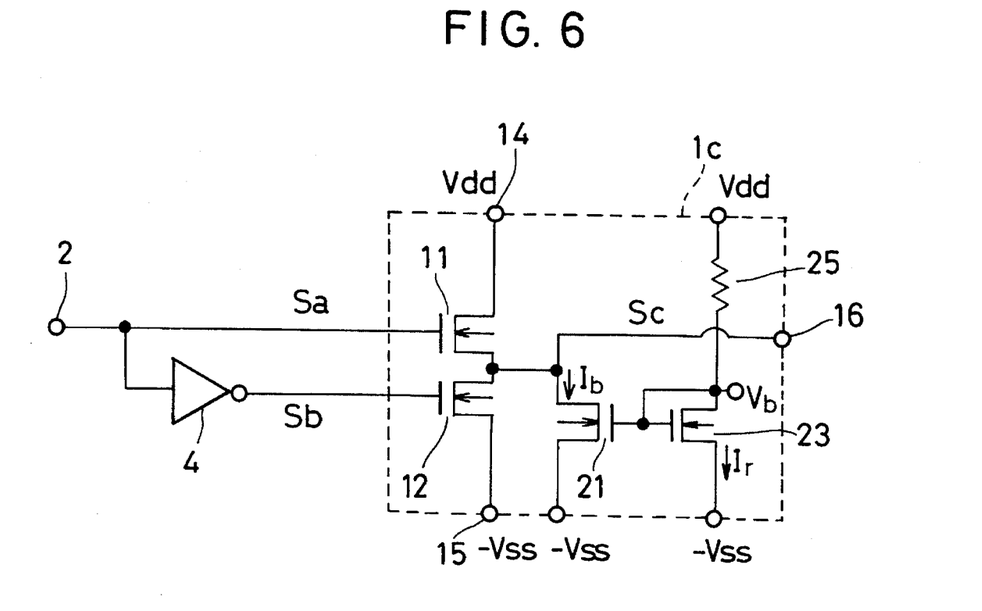
FIG. 6 is a circuit diagram of an output buffer circuit according to a fourth embodiment of the invention.

FIG. 6 shows an output buffer circuit 1c according to a fourth embodiment, which is the same in configuration as that of the third embodiment except that a resistor 25 is provided instead of the fourth MOSFET 25 in the third embodiment.

One end of the resistor 25 is applied with the positive supply voltage $V_{dd}$ and the other end is connected to the coupled drain and gate of the fourth MOSFET 23.

The operation of the circuit 1c of the fourth embodiment is substantially the same as the circuit 1b of the third embodiment.

If the resistance of the resistor 25 is very high such as 1 MΩ, the bias voltage $V_b$ is approximately equal to the threshold voltage $V_{TH}$, i.e., $V_b = V_{TH}$. Therefore, when the first, third and fourth MOSFETs 11, 21 and 23 have the same channel-width to channel-length ratio, the operating point of the first MOSFET 11 is set at the point B. If the third MOSFET 21 has the channel-width to channel-length ratio twice as much as that of the fourth MOSFET 23, the operating point of the first MOSFET 11 is set at a point where $V_b$ is 2 $V_{TH}$ or $I_b$ is 2 $I_{TH}$.

Thus, in the fourth embodiment, the operating point of the first MOSFET 11 can be set by adjusting the ratio of the channel-width to channel-length ratios (W/L) of the third and fourth MOSFETs 21 and 23.

FIFTH EMBODIMENT

Figure 7:
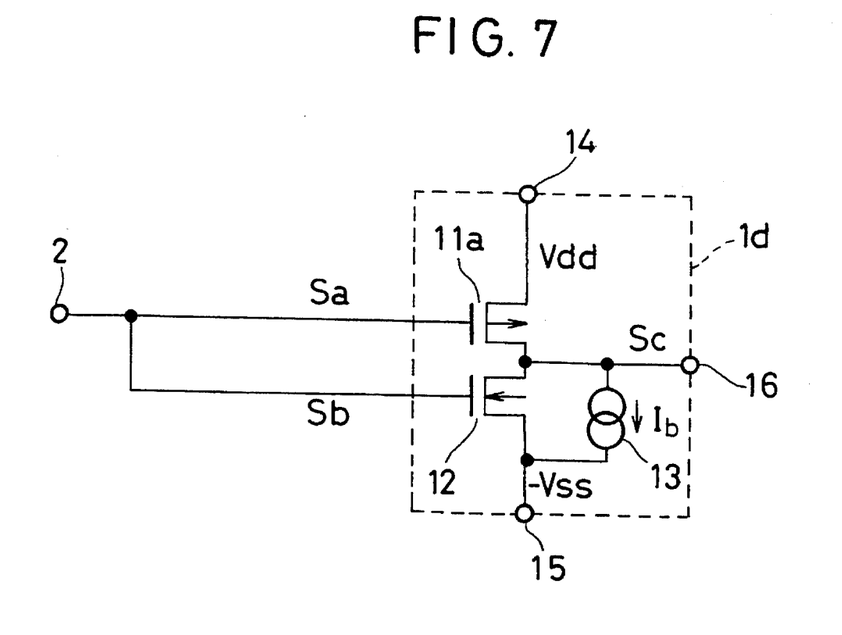
FIG. 7 is a circuit diagram of an output buffer circuit according to a fifth embodiment of the invention.

FIG. 7 shows an output buffer circuit 1d according to a fifth embodiment, which is the same in configuration as that of the first embodiment except that a p-channel enhancement MOSFET 11a is provided instead of the first MOSFET 11 and the inverter 4 is omitted. Therefore, the circuit 1d has the complementary MOS (CMOS) configuration.

One end of the resistor 25 is applied with the positive supply voltage $V_{dd}$ and the other end is connected to the coupled drain and gate of the fourth MOSFET 23.

The operation of the circuit 1d of the fifth embodiment is substantially the same as the circuit 1 of the first embodiment, and therefore, the same effects or advantages can be obtained.

The output buffer circuits according to the first to fifth embodiments have two supply terminals 14 and 15 that are applied with the positive and negative supply voltages $V_{dd}$ and $V_{ss}$, respectively. However, one of the terminals 14 and 15 may be grounded. In this case, the voltage swing of the output signal Sc is reduced.

In the above first to fourth embodiments, n-channel MOSFETs are employed. However, it is needless to say that p-channel MOSFETs may be employed.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An output buffer circuit comprising:

a first FET whose gate is applied with a first input digital signal;

a second FET whose gate is applied with a second input digital signal;

said first FET and said second FET being serially connected to each other and operating to be opposite in logic state to each other; and a current source for causing a bias current having the same direction as that of a drain current of said first FET to flow through said first FET in the OFF state;

wherein a digital output signal is taken out from a connection point of said first FET and said second FET;

and wherein a turn-on speed of said first FET from the pseudo-OFF state to the ON state is enhanced by said bias current.

2. An output buffer circuit as claimed in, claim 1, wherein an equation of $I_{TH} < I_b \leq 100 I_{TH}$ is established, where $I_b$ is said bias current and $I_{TH}$ is a threshold current of said first FET.

3. An output buffer circuit as claimed in claim 1, wherein an equation of $2I_{TH} \leq I_b \leq 50 I_{TH}$ is established, where $I_b$ is said bias current and $I_{TH}$ is a threshold current of said first FET.

4. An output buffer circuit as claimed in claim 1, wherein said current source is composed of a third FET connected in parallel to said second FET, and a voltage source for supplying a bias voltage to a gate of said third FET;

and wherein said bias voltage is adjusted to provide said bias current by said third FET.

5. An output buffer circuit as claimed in claim 4, wherein said voltage source is made of a fourth FET whose gate and drain are coupled together;

and wherein said coupled gate and drain of said fourth FET is connected to said gate of said third.

6. An output buffer circuit as claimed in claim 4, wherein said voltage source is made of a fourth FET whose gate and drain are coupled together and a fifth FET whose gate and drain are coupled together, said fourth FET and said fifth FET being serially connected;

and wherein said coupled gate and drain of said fourth FET is connected to said gate of said third FET;

and wherein said bias voltage is defined by a ratio of resistances of said fourth FET and said fifth FET.

7. An output buffer circuit as claimed in claim 4, wherein said voltage source is made of a fourth FET whose gate and drain are coupled together and a resistor connected to said coupled gate and drain of said fourth FET;

and wherein said coupled gate and drain of said fourth FET is connected to said gate of said third;

and wherein said bias voltage is defined by a ratio, of resistances of said fourth FET and said resistor.

8. An output buffer circuit as claimed in claim 1, wherein said current source is composed of a current mirror circuit made of a third FET and a fourth FET;

and wherein said third FET is connected in parallel to said second FET and produces said bias current proportional to a reference current;

and wherein said fourth FET produces said reference current.

9. An output buffer circuit as claimed in claim 4, wherein said current source is composed of a current mirror circuit made of a third FET, a fourth FET and a fifth FET;

and wherein said third FET is connected in parallel to said second FET and produces said bias current proportional to a reference current;

and wherein said fourth FET and said fifth FET produce said reference current;

and wherein said reference current is defined by a ratio of resistances of said fourth FET and said fifth FET.

10. An output buffer circuit as claimed in claim 4, wherein said current source is composed of a current mirror circuit made of a third MET, a fourth FET and a resistor;

and wherein said third FET is connected in parallel to said second FET and produces said bias current proportional to a reference current;

and wherein said fourth FET and said resistor produce said reference current;

and wherein said reference current is defined by a ratio of resistances of said fourth FET and said resistor.

11. In a logic circuit including a first FET whose gate is applied with a first input digital signal, and a second FET whose gate is applied with a second input digital signal; said first FET and said second FET being serially connected to each other and operating to be opposite in logic state to each other; and a digital output signal being taken out from a connection point of said first FET and said second FET;

said logic circuit comprising:

a current source for causing a bias current having the same direction as that of a drain current of said first FET to flow through said first MET in the pseudo-OFF state;

wherein a turn-on speed of said first FET from the OFF state to the ON state is enhanced by said bias current.

12. A logic circuit as claimed in claim 11, wherein an equation of $I_{TH} < I_b \leq 100 I_{TH}$ is established, where $I_b$ is said bias current and $I_{TH}$ is a threshold current of said first FET.

13. A logic circuit as claimed in claim 11, wherein an equation of $2I_{TH} \leq I_b \leq 50 I_{TH}$ is established, where $I_b$ is said bias current and $I_{TH}$ is a threshold current of said first FET.

14. An output buffer circuit as claimed in claim 11, wherein said current source is composed of a third FET connected in parallel to said second FET, and a voltage source for supplying a bias voltage to a gate of said third FET;

and wherein said bias voltage is adjusted to provide said bias current by said third FET.

15. An output buffer circuit as claimed in claim 14, wherein said voltage source is made of a fourth FET whose gate and drain are coupled together;

and wherein said coupled gate and drain of said fourth FET is connected to said gate of said third.

16. An output buffer circuit as claimed in claim 14, wherein said voltage source is made of a fourth FET whose gate and drain are coupled together and a fifth FET whose gate and drain are coupled together, said fourth FET and said fifth FET being serially connected;

and wherein said coupled gate and drain of said fourth FET is connected to said gate of said third FET;

and wherein said bias voltage is defined by a ratio of resistances of said fourth FET and said fifth FET.

17. An output buffer circuit as claimed in claim 14, wherein said voltage source is made of a fourth FET whose gate and drain are coupled together and a resistor connected to said coupled gate and drain of said fourth FET;

and wherein said coupled gate and drain of said fourth FET is connected to said gate of said third;

and wherein said bias voltage is defined by a ratio of resistances of said fourth FET and said resistor.

18. An output buffer circuit as claimed in claim 10, wherein said current source is composed of a current mirror circuit made of a third FET and a fourth FET;

and wherein said third FET is connected in parallel to said second FET and produces said bias current proportional to a reference current;

and wherein said fourth FET produces said reference current.

19. An output buffer circuit as claimed in claim 14, wherein said current source is composed of a current mirror circuit made of a third FET, a fourth FET and a fifth FET;

and wherein said third FET is connected in parallel to said second FET and produces said bias current proportional to a reference current;

and wherein said fourth FET and said fifth FET produce said reference current;

and wherein said reference current is defined by a ratio of resistances of said fourth FET and said fifth FET.

20. An output buffer circuit as claimed in claim 14, wherein said current source is composed of a current mirror circuit made of a third FET, a fourth FET and a resistor;

and wherein said third FET is connected in parallel to said second FET and produces said bias current proportional to a reference current;

and wherein said fourth FET and said resistor produce said reference current;

and wherein said reference current is defined by a ratio of resistances of said fourth FET and said resistor.

\* \* \* \* \*